United States Patent [19]
Ruitenburg

[11] Patent Number: 5,867,771
[45] Date of Patent: Feb. 2, 1999

[54] CIRCUIT ARRANGEMENT COMPRISING A TUNER AND A SPLITTER-MODULATOR

[75] Inventor: Leo Ruitenburg, Swalmen, Netherlands

[73] Assignee: U.S. Philips Corporation, New York, N.Y.

[21] Appl. No.: 733,307

[22] Filed: Oct. 17, 1996

[30] Foreign Application Priority Data

Oct. 17, 1995 [DE] Germany .................. 195 38 544.6

[51] Int. Cl.⁶ .................................. H04B 1/48
[52] U.S. Cl. ................ 455/86; 455/187.1; 455/189.1; 455/315
[58] Field of Search ................ 455/78, 76, 80, 455/81, 82, 83, 84, 86, 575, 313, 314, 315, 316, 317, 187.1, 188.1, 189.1, 191.1

[56] References Cited

U.S. PATENT DOCUMENTS

| | | |
|---|---|---|
| 4,379,271 | 4/1983 | Lehmann . |
| 5,640,688 | 6/1997 | Ruitenburg ............... 455/84 |
| 5,722,053 | 2/1998 | Kornfeld et al. ........... 455/86 |

FOREIGN PATENT DOCUMENTS

| | | |
|---|---|---|
| 0679024A2 | 10/1995 | European Pat. Off. . |
| 404298128 | 10/1992 | Japan ................ 455/78 |
| 406132847 | 5/1994 | Japan ................ 455/78 |

OTHER PUBLICATIONS

New High Density Multistandard RF–Concept For VCR G.M. Maier, B. Fischer, A. Selz, J. Lance, T.F. Tey Thomson Consumer Electronics R&D Labs Germany/Singapore.

Primary Examiner—Thanh Cong Le
Attorney, Agent, or Firm—Edward W. Goodman

[57] ABSTRACT

A circuit arrangement includes a tuner and a splitter-modulator having a splitter and a modulator. The splitter includes an RF signal input for receiving an RF input signal, an RF signal output for supplying an RF output signal, a first line for applying the RF input signal to the tuner and a second line for receiving an RF output signal from the modulator. The tuner is adapted to demodulate the RF input signal, and the modulator is adapted to convert a baseband signal into the RF output signal to be supplied by said modulator. The circuit arrangement further includes devices for generating reference oscillations for the tuner and the splitter-modulator, these devices having at least one quartz crystal which is common for the tuner and the splitter-modulator, and a phase-locked loop which is common for the tuner and the splitter-modulator. A possibly compact construction by using a minimal number of components at low manufacturing costs is achieved in that the tuner includes at least one signal-processing branch for frequency-selective reception, amplification and/or frequency conversion of the RF signals of each frequency band, and the devices for generating reference oscillations (oscillation generator) include a separate oscillator stage for each signal-processing branch, one of these oscillator stages also being used for generating the reference oscillation for the splitter-modulator.

1 Claim, 3 Drawing Sheets

CIRCUIT ARRANGEMENT COMPRISING A TUNER AND A SPLITTER-MODULATOR

BACKGROUND OF THE INVENTION

1. Field of the Invention

The invention relates to a circuit arrangement comprising a tuner and a splitter-modulator comprising a splitter and a modulator, in which the splitter has an RF signal input for applying an RF input signal, an RF signal output for supplying an RF output signal, a first line for applying the RF input signal to the tuner and a second line for supplying an RF output signal from the modulator, the tuner being adapted to demodulate the RF input signal and the modulator being adapted to convert a baseband signal into the RF output signal to be supplied by said modulator, and comprising devices for generating reference oscillations for the tuner and the splitter-modulator, said devices having at least one quartz crystal which is common for the tuner and the splitter-modulator, and a phase-locked loop which is common for the tuner and the splitter-modulator.

2. Description of the Related Art

Such a circuit arrangement is described in European Patent Application 95 200 961.1, corresponding to U.S. Pat. No. 5,640,688. The object of this circuit arrangement described in said application is the use of a small number of components for a circuit arrangement comprising both a tuner and a splitter-modulator. An arrangement having a particularly small number of components uses a sole oscillation generator with a single oscillator stage, both for the modulator in the splitter and for the tuner.

For tuning the tuner to different transmitters, a synchronization of the adjustment of filter stages in the tuner and the adjustment of the oscillator stage is required, which necessitates the use of a large number of components in the dimensioning of the tuning element of the filter stages and the oscillator stage when strict requirements are imposed on the signal-processing quality.

SUMMARY OF THE INVENTION

It is an object of the invention to achieve a structure which is as compact as possible by using a minimal number of components at low manufacturing costs in a circuit arrangement of the type described hereinbefore.

In a circuit arrangement according to the invention, this object is solved in that the tuner comprises at least one signal-processing branch for frequency-selective reception, amplification and/or frequency conversion of the RF signals of each frequency band, and the devices for generating reference oscillations (oscillation generator) comprise a separate oscillator stage for each signal-processing branch, one of these oscillator stages also being used for generating the reference oscillation for the splitter-modulator.

In the circuit arrangement according to the invention, a separate oscillator stage is thus used for each frequency band in each associated signal-processing branch. This stage may be optimally adapted to the filter stages of this signal-processing branch. A very elaborate adaptation of a sole oscillator stage to filter stages of different signal-processing branches for different frequency bands is thereby avoided. On the other hand, one of the oscillator stages is also used for the modulator for supplying a required carrier oscillation. Dependent on the frequency band in which the modulator is to supply the RF output signal, the modulator can be connected to the appropriate oscillator stage, in case there is a plurality of signal-processing branches and a plurality of frequency bands in the tuner. The operation of the circuit arrangement is particularly simplified in that either only the tuner or the modulator is operated. However, the invention provides the possibility of simultaneous operation.

These and other aspects of the invention will be apparent from and elucidated with reference to the embodiments described hereinafter.

BRIEF DESCRIPTION OF THE DRAWINGS

In the drawings, corresponding elements have identical reference signs.

DESCRIPTION OF THE PREFERRED EMBODIMENTS

Figure 1:
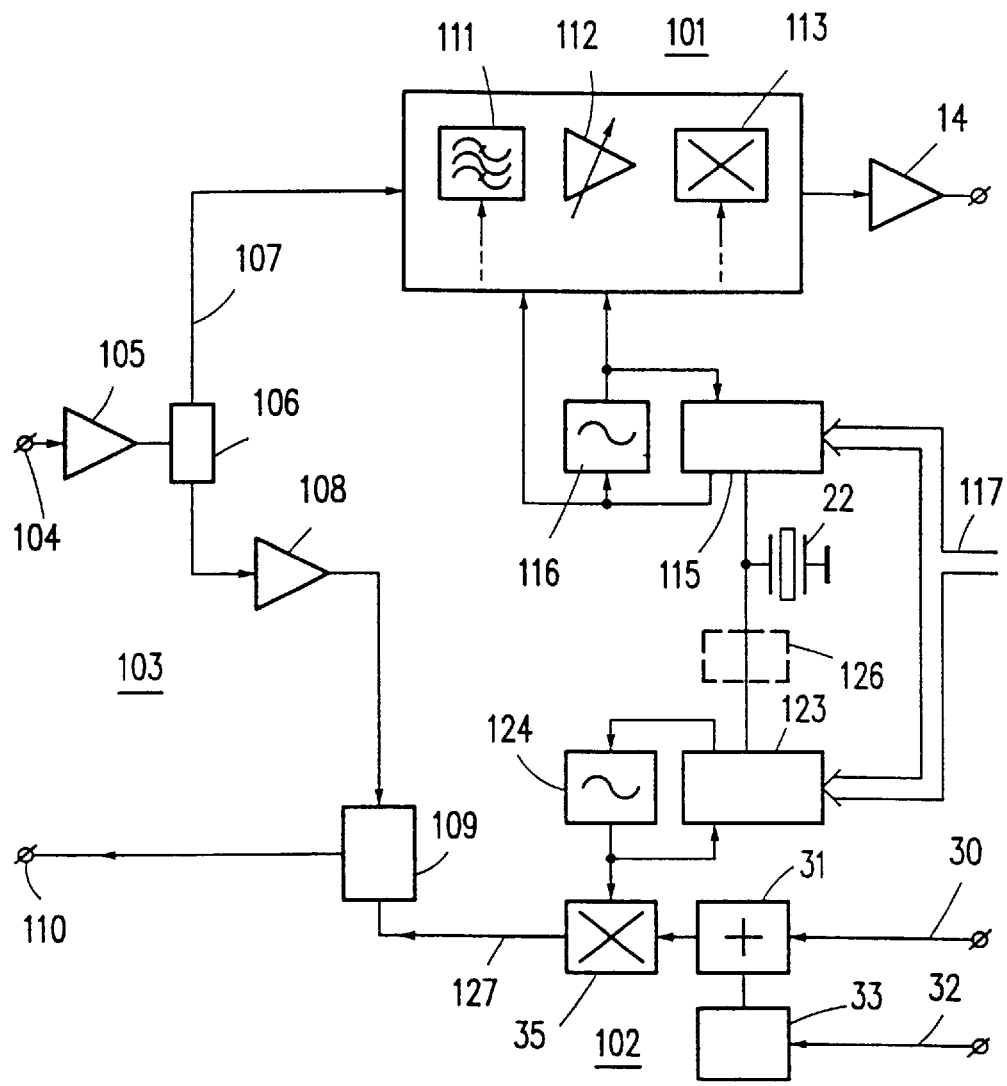
FIG. 1 shows a circuit arrangement as described in European Patent Application 95 200 961.1, to explain the various terms.

FIG. 1 shows a combination of a tuner 101, a modulator 102 and a splitter 103, in which modulator 102 and splitter 103 are combined to form a splitter-modulator. An RF input signal, for example, a television signal, can be applied from an antenna to the splitter 103 via an RF signal input 104. This signal is applied via a first preamplifier 105 to a first signal splitter 106 and from this splitter to a first line 107, and to a second signal splitter 109 via a second preamplifier 108. The signal can be supplied from the splitter via an RF signal output 110.

The RF input signal is applied through the first line 107 to the tuner 101 in which a frequency selection 111, an amplitude control 112 and a downconversion 113 are customarily performed by stages which are conventionally used for this purpose. An IF signal is supplied via an output amplifier 114. Reference oscillations from an oscillation generator associated with the tuner 101 and comprising a phase-locked loop 115 and an oscillator stage 116 are applied in conventional manner to the frequency selection stage 111 and the downconversion stage 113. The phase-locked loop 115 is controllable via control lines 117, preferably an I2C bus, for the purpose of tuning the tuner 101.

The modulator 102 comprises a known audio signal modulator 33, an audio signal input 32 of which can receive an audio baseband signal which is modulated on a sound carrier oscillation. The modulated audio signal is superimposed, in a low-frequency signal superposition stage 31, on a baseband video signal supplied via an input 30. The FBAS signal thus obtained is modulated on an RF carrier oscillation in a modulator stage 35, which oscillation is generated in an oscillation generator of the modulator 102, this oscillation generator comprising a second phase-locked loop 123 and a second oscillator stage 124. In principle, the oscillation generator 123, 124 of the modulator 102 has the same structure as that for the tuner 101. Particularly, both oscillation generators 115, 116 and 123, 124 are controlled by a single crystal oscillator, while a transistor coupling stage 126 for amplifying the oscillation and low-ohmic coupling may be arranged between the crystal oscillator 22 and the second phase-locked loop 123.

A second line 127 supplies the RF output signal of the modulator 102 from the modulator stage 35 to the second signal splitter 109 of the splitter 103, via which it reaches the RF signal output 110.

Figure 2:
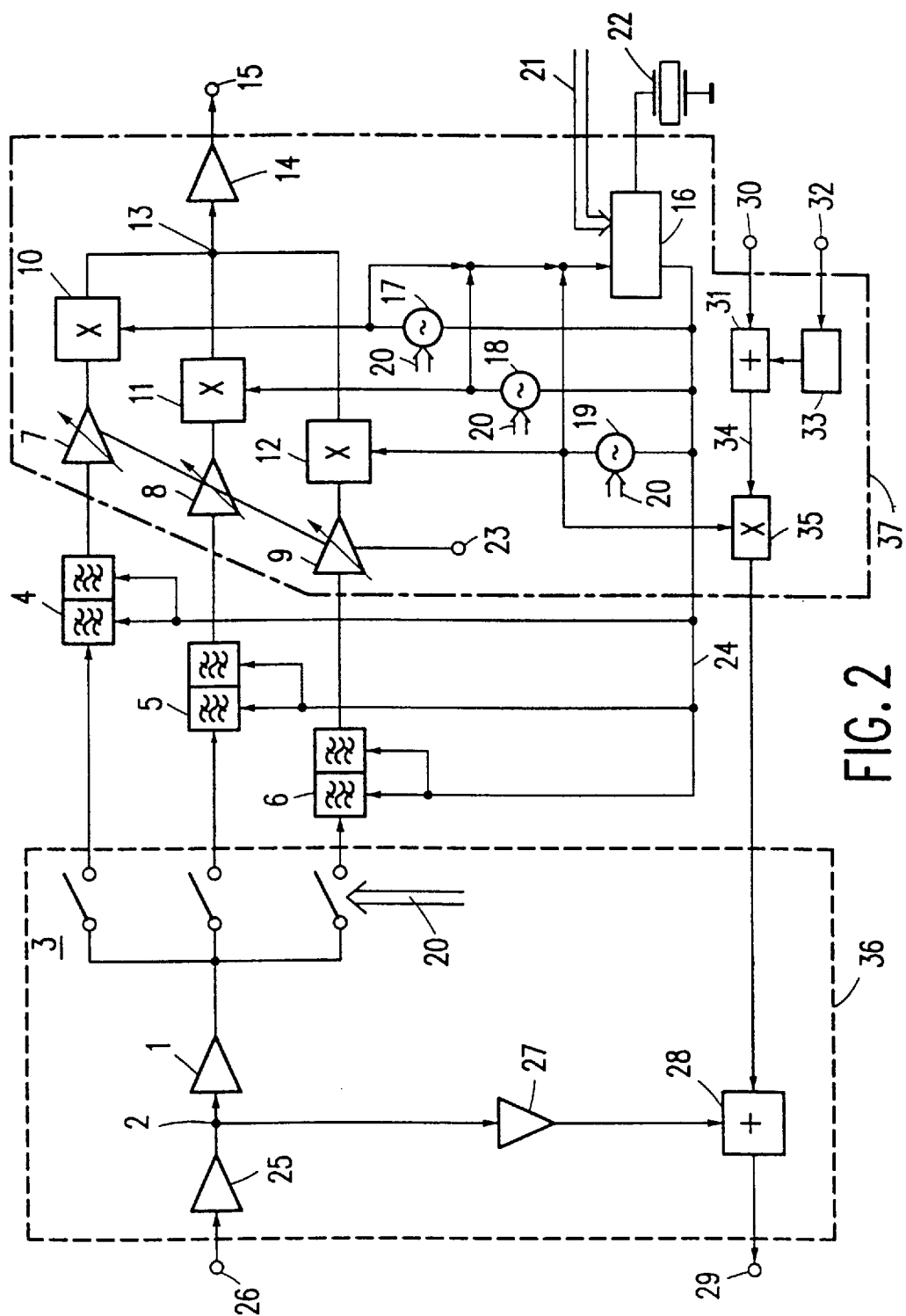
FIG. 2 shows a first embodiment according to the invention.

The embodiment shown in FIG. 2 comprises a wideband input amplifier 1 which is connected at the input to an input 2 for the RF signals and at the output to a switching stage 3, and three signal-processing branches connected to the switching stage 3 and terminated by a signal junction. Each signal-processing branch in FIG. 2 comprises filter stages 4, 5 and 6 connected to the switching stage 3, controllable amplifier stages 7, 8 and 9 connected to the filter stages 4, 5 and 6 and mixer stages 10, 11 and 12 connected to the associated controllable amplifier stages 7, 8 and 9, respectively. The RF signals are applied from the input 2 via the wideband input amplifier and the switching stage 3 optionally to one of the signal-processing branches. In the signal-processing branch, the desired frequency band associated with the signal-processing branch is selected in the filter stage 4, 5 or 6. Via the controllable amplifier stages 7, 8, 9, the RF signals of only the filtered frequency band are applied to the mixer stages 10, 11 and 12 and downconverted in frequency in the mixer stages 10, 11 and 12. The signal junction, formed in the arrangement of FIG. 2 by a node 13 and an output amplifier 14, enables the downconverted RF signals to be supplied to a common output 15. The signal junction may alternatively comprise only the node; together with the output 15, the output amplifier 14 is then associated with an output branch which is common for all signal-processing branches.

To generate the oscillations required for downconverting the RF signals, a common oscillation generator is used in the arrangement of FIG. 2, this oscillation generator comprising a phase-locked loop 16 which is common for all signal-processing branches and a separate oscillator stage 17, 18, 19 for each signal-processing branch. The phase-locked loop 16 and the oscillator stages 17, 18, 19 are interconnected in known manner. To exclude interference between the signal-processing branches, the oscillator stages 17, 18, 19 may be optionally switched on or off via a data line 20 so that an oscillation is only supplied by that oscillator stage 17, 18, 19 whose signal-processing branch is connected via the switching stage 3 to the input 2 (via the input amplifier 1). The data line 20 may then also be connected to the switching stage 3 in the same manner. Moreover, the frequency of the oscillation supplied by the oscillation generator 16 to 19 is adjustable via a data input 21 of the phase-locked loop 16. The oscillation generator 16 to 19 is further connected to a crystal oscillator 22 as a frequency reference.

The controllable amplifier stages 7, 8, 9 have a control input 23 via which the gain factor of the amplifier stages 7, 8, 9 is adjustable. The controllable amplifier stages 7, 8, 9 may then be inserted in a control loop for amplitude or power control of the RF signals.

The data line 20 as well as the data input 21 of the phase-locked loop 16 may be connected to a control (not shown) for receiver operation of the tuner.

The filter stages 4, 5, 6 are connected via a line 24 of the phase-locked loop 16. Via this line 24, signals for frequency selection by the oscillation generator 16 to 19 may be supplied in a conventional manner. Particularly, tuning diodes in the filter stages 4, 5, 6 are tuned in the same way as the oscillator stages 17, 18, 19.

FIG. 2 further shows the insertion of the tuner described in the previous embodiment in an RF signal-processing unit of a video recorder. To this end, FIG. 2 shows a further input amplifier stage 25 which is connected at the input to an antenna input 26 of the video recorder and at the output to the input 2 of the tuner for the RF signals. The input 2 is further connected via a bridging amplifier 27 to an input of an RF signal superposition stage 28. Its output constitutes an antenna output 29 of the video recorder.

An input 30 for the baseband video signal constitutes a first input of a low-frequency signal superposition stage 31. An input 32 for an audio signal is connected to an audio signal modulator stage 33. This stage is connected to a second input of the low-frequency signal superposition stage 31. In the audio signal modulator stage 33, the audio signal supplied from input 32 is modulated on a subcarrier oscillation and subsequently additively superimposed on the baseband video signal in the low-frequency superposition stage 31. In this way, an FBAS signal is generated and supplied via an output 34 of the low-frequency superposition stage 31. The output 34 is connected to a modulator stage 35 in which the FBAS signal is upconverted with an oscillation from one of the oscillator stages, here the oscillator stage 19 for the third signal-processing branch. An RF signal, which is applied to the RF signal superposition stage 28 for further supply to the antenna output 29 of the video recorder, is then produced.

In FIG. 2, the elements within the broken line 36 are advantageously combined to an integrated group of components. In a corresponding manner, the elements within the dot-and-dash line 37 may be combined to a further integrated group of components. These integrated groups may particularly be integrated on a semiconductor body.

Figure 3:
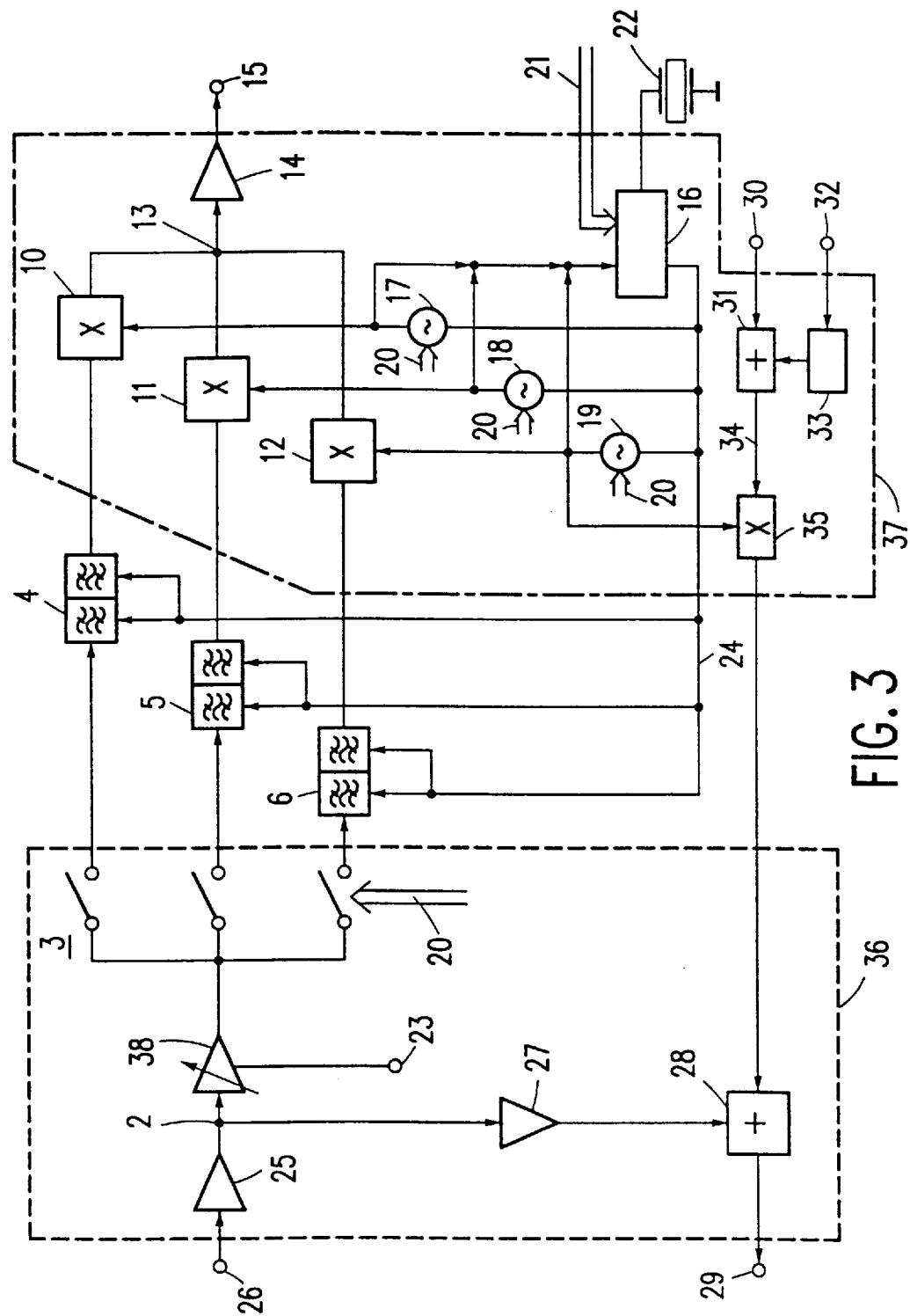
FIG. 3 shows a second embodiment according to the invention.

FIG. 3 shows a second embodiment of the tuner according to the invention. As compared with the embodiment shown in FIG. 2, the wideband input amplifier 1 is replaced by a wideband controllable input amplifier 38 which is only connected to the control input 23 for the purpose of amplitude or power control of the RF signals. On the other hand, the controllable amplifier stages 7, 8, 9 in the signal-processing branches are dispensed with; in a modification of FIG. 3, they may be replaced by amplifier stages having constant gain factors in so far as a further signal amplification or return loss attenuation is desired at these positions.

Otherwise, the embodiments shown in FIGS. 2 and 3 are identical.

In the Figures described hereinbefore, the tuner 101 comprises the elements denoted by the reference numerals 3 to 13 in FIGS. 2 and 3, the modulator 102 comprises the elements 30 to 35 and the splitter 103 comprises preferably the elements 1, 2, 25, 27 and 28 in the embodiments shown in FIGS. 2 and 3. Since the splitter shown in FIG. 1 not only splits the signal but also combines the signal by means of the second signal splitter 109, whose function corresponds to the RF signal superposition stage 28 in FIGS. 2 and 3, it may also be referred to as a splitter-combiner. The first signal splitter 106 then takes over the function of the input 2 for the RF signals. Moreover, the RF signal input 104 corresponds to the antenna input 26 of the video recorder, the first amplifier 105 corresponds to the further input amplifier stage 25, the second preamplifier 108 corresponds to the bridging amplifier 27 and the RF signal output 110 corresponds to the antenna output 29 of the video recorder. The frequency selection 111 in FIG. 1 is performed by the filter stages 4 to 6 in FIGS. 2 and 3, and the amplitude control 112 is performed by the controllable amplifier stages 7 to 9, while the downconversion 113 is performed in the mixer stages 10 to 12. In FIGS. 2 and 3, the data input 21 fulfils the function of the control lines 117 of FIG. 1.

The invention is preferably used in RF processing stages of satellite receivers and video recorders.

I claim:

1. A circuit arrangement comprising a tuner and a splitter-modulator comprising a splitter and a modulator, the splitter having an RF signal input for receiving an RF input signal, an RF signal output for supplying an RF output signal, a first line for applying the RF input signal to the tuner and a second line for receiving an RF output signal from the modulator, the tuner being adapted to demodulate the RF input signal, and the modulator being adapted to convert a baseband signal into the RF output signal to be supplied by said modulator, said circuit arrangement further comprising devices for generating reference oscillations for the tuner and the splitter-modulator, said devices having at least one quartz crystal which is common for the tuner and the splitter-modulator, and a single phase-locked loop which is common for the tuner and the splitter-modulator, characterized in that the tuner comprises at least two signal-processing branches for frequency-selective reception, amplification and/or frequency conversion of the RF signals of each frequency band, and the devices for generating reference oscillations comprise a separate oscillator stage for each of said at least two signal-processing branches, one of said separate oscillator stages also being used for generating the reference oscillation for the splitter-modulator.

* * * * *